(12) United States Patent
Lu et al.

(10) Patent No.: US 9,768,136 B2
(45) Date of Patent: Sep. 19, 2017

(54) INTERCONNECT STRUCTURE AND METHOD OF FABRICATING SAME

(71) Applicant: Taiwan Semiconductor Manufacturing Company, Ltd., Hsin-Chu (TW)

(72) Inventors: Wen-Hsiung Lu, Jhonghe (TW); Wei-Yu Chen, Taipei (TW); Hsuan-Ting Kuo, Taichung (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/180,929

(22) Filed: Jun. 13, 2016

(65) Prior Publication Data
US 2016/0284658 A1   Sep. 29, 2016

Related U.S. Application Data

(62) Division of application No. 14/198,262, filed on Mar. 5, 2014, now Pat. No. 9,368,398.

(Continued)

(51) Int. Cl.
*H01L 23/48* (2006.01)
*H01L 29/40* (2006.01)
(Continued)

(52) U.S. Cl.
CPC ............ *H01L 24/13* (2013.01); *H01L 21/568* (2013.01); *H01L 21/768* (2013.01); *H01L 21/76825* (2013.01); *H01L 21/76828* (2013.01); *H01L 21/76832* (2013.01); *H01L 23/293* (2013.01); *H01L 23/315* (2013.01); *H01L 23/3135* (2013.01); *H01L 23/3171* (2013.01); *H01L 23/3192* (2013.01); *H01L 24/05* (2013.01);
(Continued)

(58) Field of Classification Search
CPC ... H01L 2224/1191; H01L 2224/13022; H01L 26/16; H01L 23/5329; H01L 2224/73204; H01L 23/5329; H91L 2224/73204
USPC .......................... 257/787, 780.781, 780, 781
See application file for complete search history.

(56) References Cited

U.S. PATENT DOCUMENTS 5,072,520 A   12/1991   Nelson
5,317,801 A    6/1994   Tanaka et al.
(Continued)

FOREIGN PATENT DOCUMENTS

DE   102005040213 A1   3/2006
DE   112005001949 T5   5/2007
(Continued)

*Primary Examiner* — S. V. Clark
(74) *Attorney, Agent, or Firm* — Slater Matsil, LLP

(57) ABSTRACT

An interconnect structure and a method of fabrication of the same are introduced. In an embodiment, a post passivation interconnect (PPI) structure is formed over a passivation layer of a substrate. A bump is formed over the PPI structure. A molding layer is formed over the PPI structure. A film is applied over the molding layer and the bump using a roller. The film is removed from over the molding layer and the bump, and the remaining material of the film on the molding layer forms the protective layer. A plasma cleaning is preformed to remove the remaining material of the film on the bump.

20 Claims, 13 Drawing Sheets

Related U.S. Application Data

(60) Provisional application No. 61/931,459, filed on Jan. 24, 2014.

(51) Int. Cl.

| | | |
|---|---|---|
| *H01L 23/52* | (2006.01) | |
| *H01L 23/00* | (2006.01) | |
| *H01L 21/768* | (2006.01) | |
| *H01L 21/56* | (2006.01) | |
| *H01L 23/29* | (2006.01) | |
| H01L 23/532 | (2006.01) | |
| H01L 23/525 | (2006.01) | |
| H01L 23/31 | (2006.01) | |

(52) U.S. Cl.
CPC ......... *H01L 23/3114* (2013.01); *H01L 23/525* (2013.01); *H01L 23/53295* (2013.01); *H01L 2224/0401* (2013.01); *H01L 2224/05548* (2013.01); *H01L 2224/05567* (2013.01); *H01L 2224/05568* (2013.01); *H01L 2224/05582* (2013.01); *H01L 2224/05624* (2013.01); *H01L 2224/05639* (2013.01); *H01L 2224/05644* (2013.01); *H01L 2224/05647* (2013.01); *H01L 2224/05684* (2013.01); *H01L 2224/10126* (2013.01); *H01L 2224/11* (2013.01); *H01L 2224/1181* (2013.01); *H01L 2224/1191* (2013.01); *H01L 2224/11849* (2013.01); *H01L 2224/13022* (2013.01); *H01L 2224/13024* (2013.01); *H01L 2224/13111* (2013.01); *H01L 2924/0002* (2013.01)

(56) References Cited

U.S. PATENT DOCUMENTS

| | | |
|---|---|---|
| 5,869,904 A | 2/1999 | Shoji |
| 6,037,065 A | 3/2000 | Hajmrle et al. |
| 6,158,644 A | 12/2000 | Brofman et al. |
| 6,187,615 B1 | 2/2001 | Kim et al. |
| 6,365,978 B1 | 4/2002 | Ibnabdeljalil et al. |
| 6,369,451 B2 | 4/2002 | Lin |
| 6,425,516 B1 | 7/2002 | Iwatsu et al. |
| 6,586,322 B1 | 7/2003 | Chiu et al. |
| 6,643,923 B1 | 11/2003 | Hishinuma et al. |
| 6,664,637 B2 | 12/2003 | Jimarez et al. |
| 6,933,613 B2 | 8/2005 | Akashi |
| 6,940,169 B2 | 9/2005 | Jin et al. |
| 7,187,068 B2 | 3/2007 | Suh et al. |
| 7,372,151 B1 | 5/2008 | Fan et al. |
| 7,749,882 B2 | 7/2010 | Kweon et al. |
| 7,977,783 B1 | 7/2011 | Park et al. |
| 8,264,089 B2 | 9/2012 | Alvarado et al. |
| 8,345,435 B2 | 1/2013 | Hamatani et al. |
| 8,362,612 B1 | 1/2013 | Paek et al. |
| 8,624,392 B2 | 1/2014 | Yew et al. |
| 8,735,273 B2 | 5/2014 | Lu et al. |
| 9,437,564 B2 * | 9/2016 | Lu ........................... H01L 24/13 |
| 2001/0050434 A1 | 12/2001 | Kaneda et al. |
| 2002/0001937 A1 | 1/2002 | Kikuchi et al. |
| 2002/0031868 A1 | 3/2002 | Capote et al. |
| 2002/0167077 A1 | 11/2002 | Vincent |
| 2002/0175409 A1 | 11/2002 | Tsubosaki |
| 2003/0068847 A1 | 4/2003 | Watanabe et al. |
| 2003/0096453 A1 | 5/2003 | Wang et al. |
| 2003/0153172 A1 | 8/2003 | Yajima et al. |
| 2004/0012930 A1 | 1/2004 | Grigg |
| 2004/0027788 A1 | 2/2004 | Chiu et al. |
| 2004/0072387 A1 | 4/2004 | Hong et al. |
| 2004/0266162 A1 | 12/2004 | Feng |
| 2005/0080956 A1 | 4/2005 | Zaudtke et al. |
| 2006/0038291 A1 | 2/2006 | Chung et al. |
| 2006/0063378 A1 | 3/2006 | Lin et al. |
| 2006/0189114 A1 | 8/2006 | Seto et al. |
| 2007/0045840 A1 | 3/2007 | Varnau |
| 2007/0102815 A1 | 5/2007 | Kaufmann et al. |
| 2007/0108573 A1 | 5/2007 | Chung et al. |
| 2007/0176290 A1 | 8/2007 | Park et al. |
| 2007/0184577 A1 | 8/2007 | Chung et al. |
| 2007/0187825 A1 | 8/2007 | Hashimoto |
| 2007/0267745 A1 | 11/2007 | Chao et al. |
| 2008/0001290 A1 | 1/2008 | Chou et al. |
| 2008/0150134 A1 | 6/2008 | Shinkai et al. |
| 2008/0308935 A1 | 12/2008 | Kim et al. |
| 2009/0020864 A1 | 1/2009 | Pu et al. |
| 2009/0045511 A1 | 2/2009 | Meyer et al. |
| 2009/0045513 A1 | 2/2009 | Kim et al. |
| 2009/0052218 A1 | 2/2009 | Kang |
| 2009/0120215 A1 | 5/2009 | Jacobson et al. |
| 2009/0130840 A1 | 5/2009 | Wang et al. |
| 2009/0140442 A1 | 6/2009 | Lin |
| 2009/0140942 A1 | 6/2009 | Mikkola et al. |
| 2009/0146317 A1 | 6/2009 | Shih |
| 2009/0206479 A1 | 8/2009 | Daubenspeck et al. |
| 2009/0294949 A1 | 12/2009 | Meyer |
| 2009/0314519 A1 | 12/2009 | Soto et al. |
| 2010/0065966 A1 | 3/2010 | Pendse et al. |
| 2010/0078772 A1 | 4/2010 | Robinson |
| 2010/0096754 A1 | 4/2010 | Lee et al. |
| 2010/0140760 A1 | 6/2010 | Tam et al. |
| 2010/0308449 A1 | 12/2010 | Yang et al. |
| 2011/0037158 A1 | 2/2011 | Youn et al. |
| 2011/0080713 A1 | 4/2011 | Sunohara |
| 2011/0101520 A1 | 5/2011 | Liu et al. |
| 2011/0108983 A1 | 5/2011 | Lu et al. |
| 2011/0278739 A1 | 11/2011 | Lai et al. |
| 2011/0285008 A1 | 11/2011 | Nakano |
| 2012/0006592 A1 | 1/2012 | Ouchi et al. |
| 2012/0199959 A1 | 8/2012 | Hart et al. |
| 2012/0199991 A1 * | 8/2012 | Okamoto ............ H01L 23/3142 257/790 |
| 2012/0211884 A1 | 8/2012 | Stepniak et al. |
| 2012/0261817 A1 | 10/2012 | Do et al. |
| 2013/0009307 A1 * | 1/2013 | Lu ........................... H01L 24/13 257/738 |
| 2013/0105971 A1 | 5/2013 | Daubenspeck et al. |
| 2013/0147031 A1 | 6/2013 | Chen et al. |
| 2013/0168850 A1 | 7/2013 | Samoilov et al. |
| 2013/0181338 A1 | 7/2013 | Lu et al. |
| 2014/0054764 A1 | 2/2014 | Lu et al. |
| 2014/0077361 A1 | 3/2014 | Lin et al. |
| 2014/0159223 A1 | 6/2014 | Chen et al. |
| 2014/0175639 A1 | 6/2014 | Kim et al. |
| 2014/0187103 A1 | 7/2014 | Chen et al. |
| 2014/0232017 A1 | 8/2014 | Rampley et al. |
| 2014/0256092 A1 | 9/2014 | Kuo et al. |
| 2014/0264846 A1 | 9/2014 | Chen et al. |
| 2015/0123269 A1 | 5/2015 | Chen et al. |
| 2015/0137352 A1 | 5/2015 | Chen et al. |
| 2015/0214145 A1 * | 7/2015 | Lu ........................ H01L 23/3171 257/737 |
| 2015/0235977 A1 | 8/2015 | Shao et al. |
| 2015/0243613 A1 | 8/2015 | Chen et al. |
| 2015/0249066 A1 * | 9/2015 | Lin ........................ H01L 21/565 438/126 |
| 2015/0262948 A1 | 9/2015 | Lu et al. |
| 2016/0133482 A1 * | 5/2016 | Chen ................ H01L 23/53295 438/612 |
| 2016/0218090 A1 * | 7/2016 | Yu ........................ H01L 23/5226 |

FOREIGN PATENT DOCUMENTS

| | | |
|---|---|---|
| KR | 1020070076846 | 7/2007 |
| KR | 20090018442 A | 2/2009 |
| KR | 20090120215 A | 11/2009 |
| KR | 20100131180 A | 12/2010 |
| TW | 201246540 A | 11/2012 |

* cited by examiner

INTERCONNECT STRUCTURE AND METHOD OF FABRICATING SAME

PRIORITY CLAIM AND CROSS-REFERENCE

The present application is a Divisional of U.S. patent application Ser. No. 14/198,262, entitled "Interconnect Structure and Method of Fabricating Same," filed Mar. 5, 2014, which claims priority to U.S. Provisional Application No. 61/931,459, entitled "Structure with Surface Protection Film for Wafer Level Chip Scale Package," filed on Jan. 24, 2014, which applications are hereby incorporated by reference herein in its entirety.

This application relates to the following co-pending and commonly assigned patent applications: Ser. No. 13/349,405, filed Jan. 12, 2012, entitled "Package on Package Interconnect Structure;" Ser. No. 13/751,289, filed Jan. 28, 2013, entitled "System and Method for an Improved Fine Pitch Joint;" Ser. No. 13/838,748, filed Mar. 15, 2013, entitled "Interconnect Structures and Methods of Forming Same;" Ser. No. 13/868,554, filed Apr. 23, 2013, entitled "Apparatus and Method for Wafer Separation;" Ser. No. 13/913,599, filed Jun. 10, 2013, entitled "Interconnect Joint Protective Layer Apparatus and Method;" Ser. No. 13/914,426, filed Jun. 10, 2013, entitled "Interconnect Structures and Methods of Forming Same;" Ser. No. 13/934,562, filed Jul. 3, 2013, entitled "Packaging Devices, Methods of Manufacture Thereof, and Packaging Methods; Ser. No. 13/937,599, filed Jul. 9, 2013, entitled "Interconnect Structure and Method of Fabricating Same;" and Ser. No. 13/939,966, filed Jul. 11, 2013, entitled "Apparatus and Method for Package Reinforcement," which applications are hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, wafer-level chip scale package (WLCSP) structures have emerged as an effective alternative to further reduce the physical size of semiconductor devices. In a WLCSP structure, active devices such as transistors and the like are formed at the top surface of a substrate of the WLSCP structure.

A current WLCSP process includes a four mask structure including two polyimide layers, a redistribution layer (RDL), and an under bump metallization (UBM) structure. There is a high cost for such a structure. In addition, there is no solder bump protection for the wafer-level chip scale package's large die structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
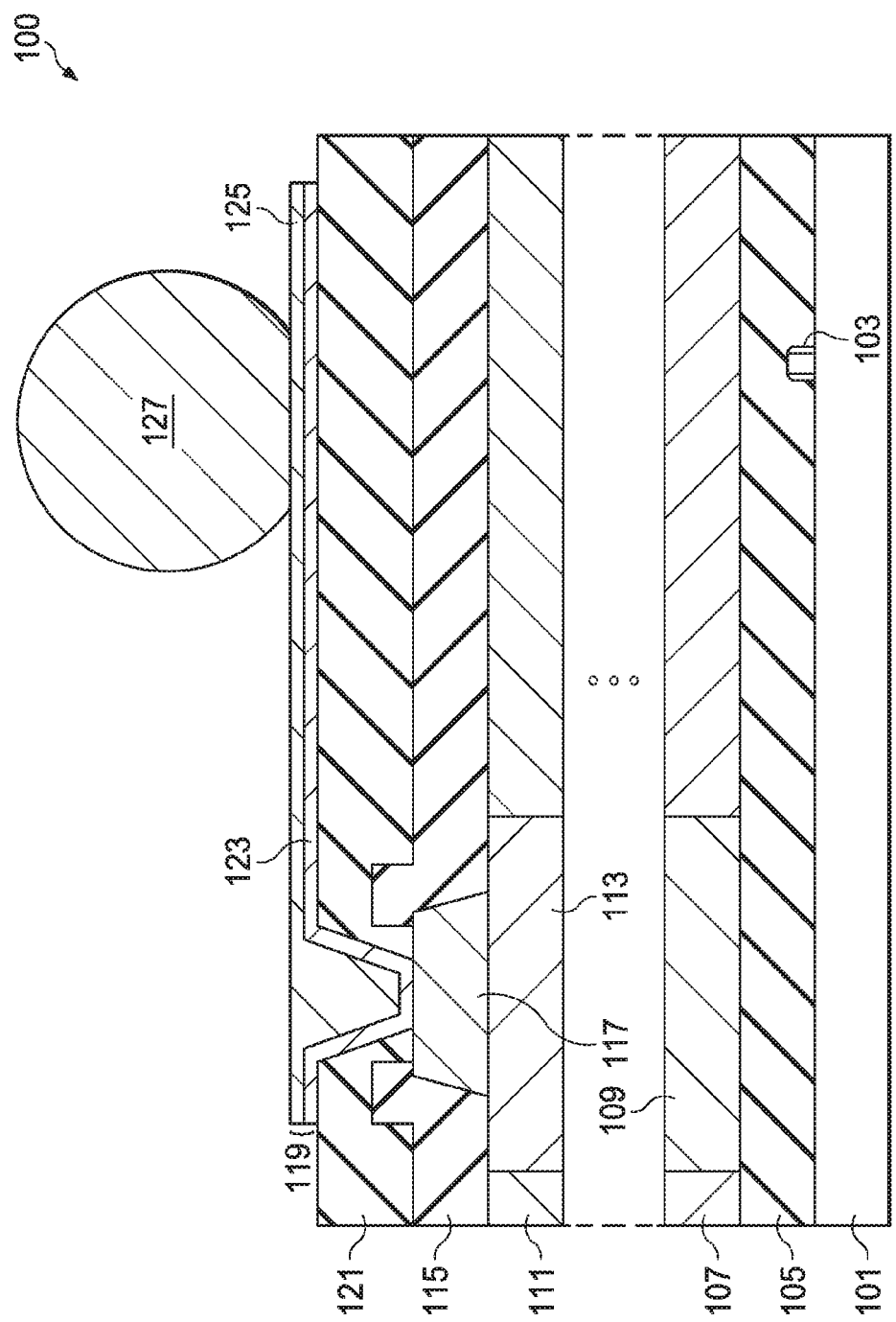
FIGS. 1-12 are cross-sectional views illustrating various intermediate stages of forming a semiconductor device having a chip scale packaging structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure will be described with respect to embodiments in a specific context, a structure and fabrication steps of a semiconductor device having a chip scale packaging structure. The embodiments of the disclosure may also be applied, however, to a variety of semiconductor devices. Hereinafter, various embodiments will be explained in detail with reference to the accompanying drawings.

FIGS. 1-12 are cross-sectional views illustrating various intermediate stages of forming a semiconductor device 100 having a chip scale packaging structure in accordance with some embodiments. Referring first to FIG. 1, the semiconductor device 100 comprises a substrate 101. The substrate 101 may be formed of silicon, silicon germanium, silicon carbide or the like. Alternatively, the substrate 101 may be a silicon-on-insulator (SOI) substrate. The SOI substrate may comprise a layer of a semiconductor material (e.g., silicon, germanium and the like) formed over an insulator layer (e.g., buried oxide and the like), which is formed in a silicon substrate. In addition, other substrates that may be used include multi-layered substrates, gradient substrates, hybrid orientation substrates and the like.

The substrate 101 may further comprise a variety of devices 103, which are represented in FIG. 1 as a single transistor. However, the devices 103 may comprise a wide variety of active and passive devices such as transistors, diodes, capacitors, resistors, inductors and the like, which may be used to generate the desired structural and functional requirements of the design for the substrate 101. The devices 103 may be formed using any suitable methods either within or on the surface of the substrate 101, or in an overlying dielectric layer. One of ordinary skill in the art will appreciate that the above examples are provided for illustrative purposes only to further explain applications of some illustrative embodiments and are not meant to limit the disclosure in any manner.

An interlayer dielectric layer (ILD) 105 is formed on top of the substrate 101 and the devices 103 and is designed to isolate the devices 103 from subsequently formed metallization layers. The ILD layer 105 is formed over the substrate 101 and the devices 103 and is designed to isolate the devices 103 from subsequently formed metallization layers. The ILD layer 105 may comprise silicon dioxide, low-k dielectric materials (materials having a dielectric constant lower than silicon dioxide) such as silicon oxynitride, phosphosilicate glass (PSG), borophosphosilicate glass (BPSG), fluorinated silicate glass (FSG), organosilicate glasses (OSG), $SiO_xC_y$, Spin-On-Glass, Spin-On-Polymers, silicon carbon material, compounds thereof, composites thereof, combinations thereof, or the like, deposited by any suitable method such as spin-on, chemical vapor deposition (CVD), and plasma-enhanced CVD (PECVD), or the like. Porous versions of the above materials may also be used. These materials and processes are provided as examples and other materials and processes may be used. It should also be noted that one skilled in the art will recognize that the ILD layer 105 may further comprise a plurality of dielectric layers.

Referring further to FIG. 1, a bottom metallization layer 107 and a top metallization layer 111 are formed over the ILD layer 105. The bottom metallization layer 107 may comprise a first interconnect structure 109. Likewise, the top metallization layer 111 may comprise a second interconnect structure 113. The first interconnect structure 109 and the second interconnect structure 113 are formed of conductive materials such as copper, silver, gold, tungsten, aluminum, combination thereof, alloys thereof, or the like. The first interconnect structure 109 and the second interconnect structure 113 may be formed through any suitable techniques (e.g., deposition, damascene, and the like). The first interconnect structure 109 and the second interconnect structure 113 are represented in FIG. 1 as a single conductive line, which is provided for illustrative purpose only. In other embodiments, the first interconnect structure 109 and the second interconnect structure 113 may comprise a plurality of conductive lines and vias, and may have a structure according to design specifications of the semiconductor device 100. Generally, the one or more inter-metal dielectric layers and the associated metallization layers are used to interconnect the devices 103 in the substrate 101 to each other to form functional circuitry and to further provide an external electrical connection.

It should be noted while FIG. 1 shows the bottom metallization layer 107 and the top metallization layer 111, one skilled in the art will recognize that one or more inter-metal dielectric layers (not shown) and the associated metallization layers (not shown) may be formed between the bottom metallization layer 107 and the top metallization layer 111. In particular, the layers between the bottom metallization layer 107 and the top metallization layer 111 may be formed by alternating layers of dielectric (e.g., extremely low-k dielectric material) and conductive materials (e.g., copper).

A passivation layer 115 is formed on top of the top metallization layer 111. In some embodiments, the passivation layer 115 may comprise one or more layers formed of silicon dioxide, undoped silicon glass (USG), silicon nitride (SiN), silicon oxynitride (SiON), phosphosilicate glass (PSG), polybenzoxazole (PBO), benzocyclobutene (BCB), a polymer such as polyimide, compounds thereof, composites thereof, combinations thereof, or the like, deposited by any suitable method, such as spin-on, CVD, PECVD, and the like.

Referring further to FIG. 1, there may be an opening formed in the passivation layer 115. The opening is used to accommodate a conductive pad 117 in the passivation layer 115. In particular, the conductive pad 117 provides a conductive channel between the second interconnect structure 113 and a post passivation interconnect (PPI) structure 119 of the semiconductor device 100. The conductive pad 117 may be formed of conductive materials such as copper, copper alloys, aluminum, silver, gold, any combinations thereof, and/or multi-layers thereof. The conductive pad 117 may be formed by suitable techniques, such as CVD, sputtering, plating, and the like.

A first dielectric layer 121 is formed on top of the passivation layer 115. The first dielectric layer 121 may be formed of materials such as epoxy, polyimide and the like. Alternatively, the first dielectric layer 121 may be formed of suitable polymer dielectric materials such as polybenzoxazole (PBO) and the like. The first dielectric layer 121 may be formed by any suitable method such as CVD, spin coating, and/or the like.

The PPI structure 119 is formed over the first dielectric layer 121 as illustrated in FIG. 1. A portion of the PPI structure 119 may extend through the first dielectric layer 121 to electrically connect to the conductive pad 117. The PPI structure 119 may comprise a barrier layer 123 and a conductive line 125 formed over the barrier layer 123. The PPI structure 119 connects the conductive pad 117 with an input/output terminal of the semiconductor device 100. In particular, the PPI structure 119 provides a conductive path between the interconnect structures in the metallization layers (e.g., the second interconnect structure 113 in the top metallization layer 111) and the input/output terminal of the semiconductor device 100. In some embodiments, the barrier layer 123 may be formed using methods such as CVD, atomic layer deposition (ALD), the like, or a combination thereof. The barrier layer 123 may comprise a nitride or an oxynitride, such as titanium nitride, titanium oxynitride, tantalum nitride, tantalum oxynitride, tungsten nitride, silicon dioxide, the like, or a combination thereof. The conductive line 125 may be formed over the barrier layer 123 using methods such as an electro-chemical plating process, CVD, ALD, physical vapor deposition (PVD), the like, or a combination thereof. In some embodiment, the conductive line 125 may comprise copper, tungsten, aluminum, silver, gold, the like, or a combination thereof.

A bump 127 is mounted on the conductive line 125 as illustrated in FIG. 1. In some embodiments, the bump 127 may be a solder ball, and may be formed of any of suitable materials such as, for example, SAC405. SAC405 comprises 95.5% Sn, 4.0% Ag and 0.5% Cu. In some embodiments, a reflow process may be employed to melt the bottom portion of the bump 127 so that bump 127 is bonded on the conductive line 125.

One advantageous feature of mounting the bump 127 on the conductive line 125 is that the direct bonding of the bump 127 on the conductive line 125 helps to reduce the fabrication cost of a wafer level chip scale package. For example, in a conventional fabrication process, in order to mount a bump on an under bump metallization (UBM) structure, there may be four mask layers formed during the fabrication process of the PPI structure 119 in accordance to some embodiments. By employing this direct bonding technique described above, the mask layers that are used for forming the UBM structure may be saved. As a result, the fabrication cost as well as the reliability of the wafer level chip scale package is improved.

Figure 2:
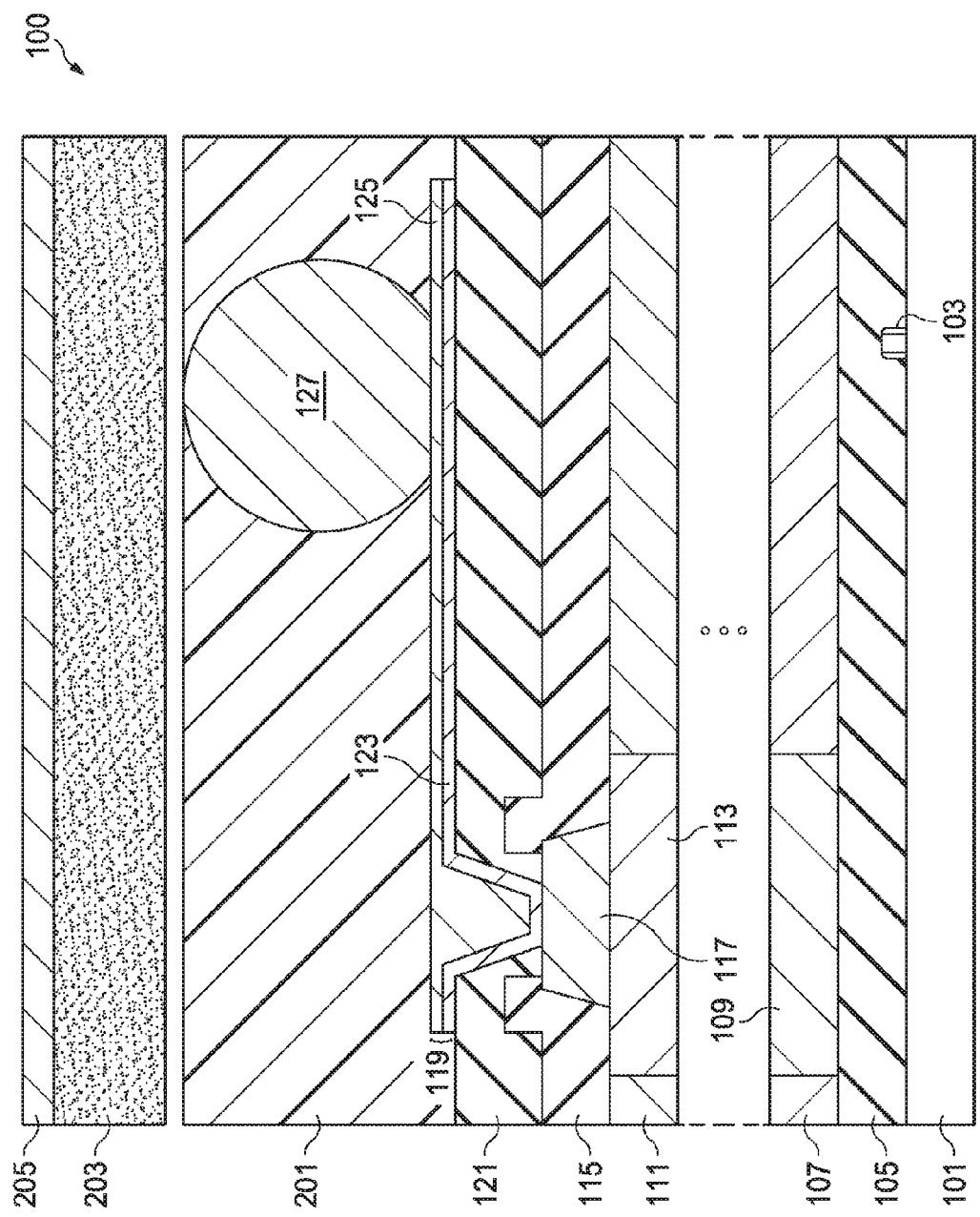

Referring to FIG. 2, a liquid molding compound (LMC) material 201 is deposited over the semiconductor device 100. In some embodiments, the LMC material 201 may comprise, for example, silica mixed with epoxy, or the like. A release film 203 may be used for pressing the LMC material 201 in accordance with some embodiments. The release film 203 is formed of soft materials such as, for example, Ethylene Tetrafluoroethylene (ETFE). In some embodiments, the release film 203 may be attached to a metal plate 205.

Figure 3:
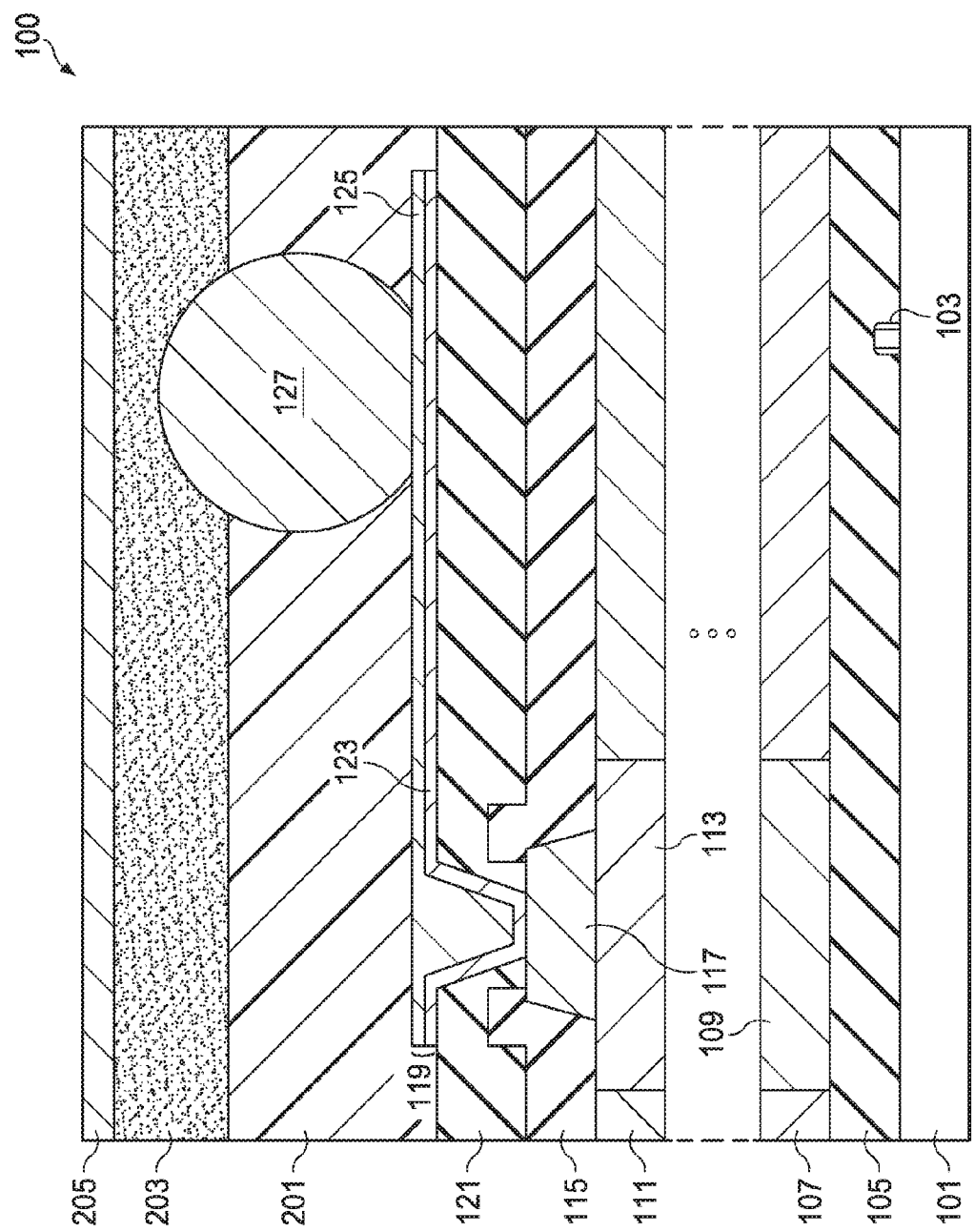

Referring to FIG. 3, as the pressure from the metal plate 205 is applied, a portion of the bump 127 is pressed into the release film 203. In addition, the release film 203 may push a portion of the LMC material 201 away from the top surface of the semiconductor device 100. As a result, the bottom surface of the release film 203 may be lower than the top end of the bump 127. Furthermore, a curing process may be applied to the LMC material 201. Such a curing process may solidify the LMC material 201 to form a molding layer over the semiconductor device 100.

Figure 4:
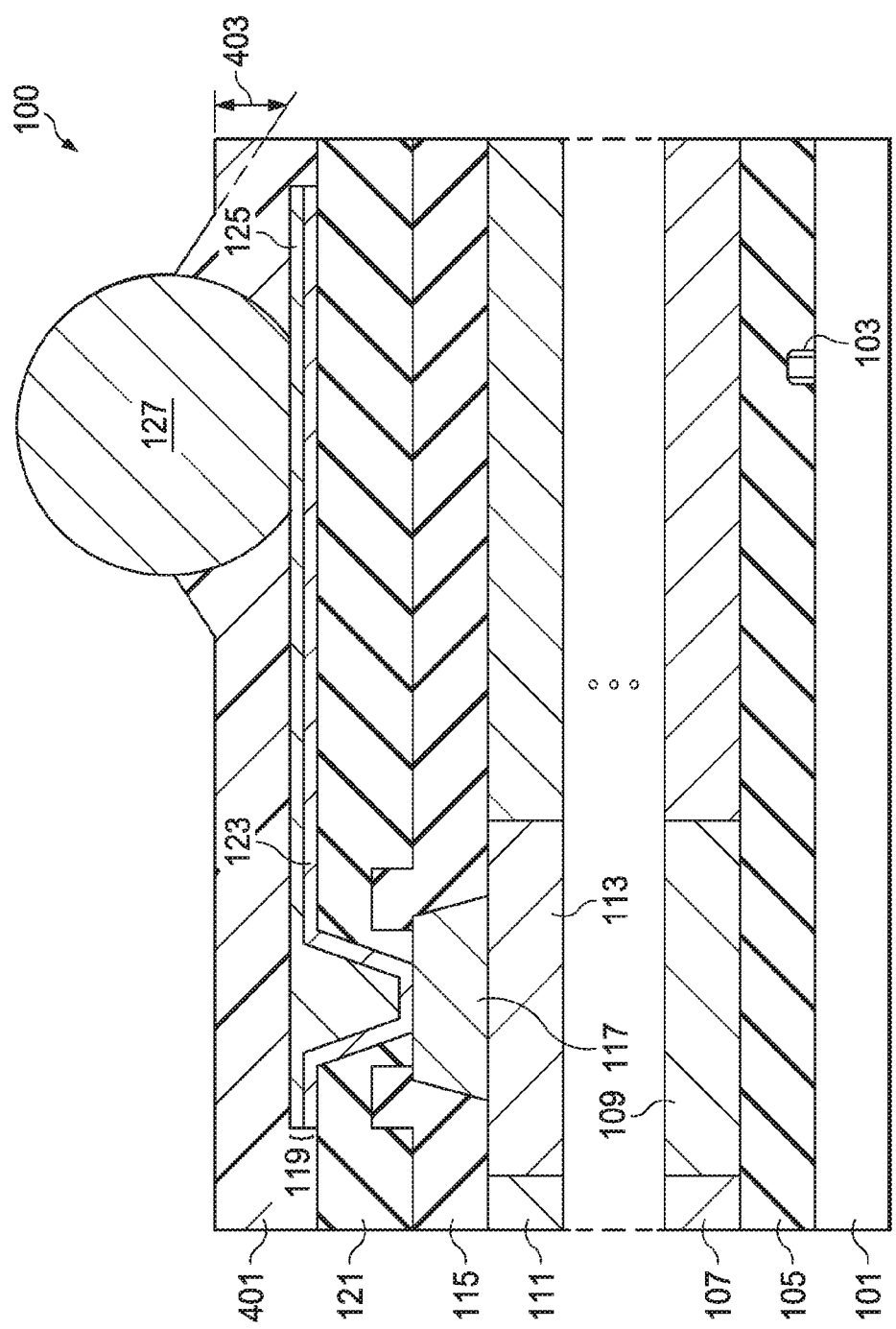

Referring to FIG. 4, the release film 203 is removed from the semiconductor device 100 exposing the molding layer 401 and the bump 127. In some embodiments, there may be a thin layer of LMC residue (not shown) left on the top surface of the bump 127. The LMC residue on the top surface of the bump 127 may be removed, for example, by suitable etching techniques such as wet or plasma etching processes. A remaining portion of the molding layer 401 is lower than the uppermost surface of the bump 127. As shown in FIG. 4, the bump 127 is partially embedded in the molding layer 401. The top surface of the molding layer 401 is approximately planar except that there may be a slope adjacent to the bump 127. The planar portions of the molding layer 401 may be formed to a thickness between about 40 μm and about 150 μm. The slope and the top surface of the molding layer 401 may form an angle 403. In some embodiments, the angle 403 may be in a range from about 30 degrees to about 70 degrees.

An advantageous feature of having the molding layer 401 is that the molding layer 401 may function as a protection layer so as to protect the bump 127 as well as the other portions of the semiconductor device 100 from heat, shock, humidity and corrosion. In addition, the molding layer 401 helps to prevent the bump 127 from cracking during reliability tests such as thermal cycling processes. Furthermore, the molding layer 401 may help to reduce the mechanical and thermal stresses during the fabrication process of the semiconductor device 100.

In some embodiments, a protective layer in addition to the molding layer 401 may be desirable to protect the semiconductor device 100. For example, the molding layer 401 may have voids (not shown) that allow water or other contaminants to reach the PPI structure 119, which may cause, for example, corrosive damage leading to a short circuit between neighboring PPI structures. In some embodiments, the molding layer 401 may have the voids with an average size about 15 μm. In some embodiments, the molding layer 401 may have the voids with an average size about 40 μm. The semiconductor device 100 may fail reliability tests such as a Pressure Cooker Test (PCT), which simulates severe temperature and humidity conditions. In some embodiments, the PCT may be performed by soaking the semiconductor device 100 in water vapor for 168 hrs at 121° C., 100% RH, and 2 atm. As discussed below in greater detail, a protective film may be formed over the molding layer 401 to seal the voids in the molding layer 401 and protect the semiconductor device 100 from harsh environmental effects.

As discussed in greater detail below a protective layer is formed over the molding layer 401. In some embodiments, a film is applied over the molding layer 401 and the bump 127. Subsequently, the film is removed and a residue of the film left behind over the molding layer 401 forms the protective layer. In some embodiments, the protective layer fills the voids in the molding layer 401 and does not allow water or other contaminants to penetrate through the molding layer 401 and reach the PPI structure 119. The film may have one or more layers of material applied individually, or in one or more groups, and may include nonconductive materials, such as polymers, resins, insulators, or the like. In some embodiments, the film may be a UV type. The film of the UV type may further comprise a UV releasable adhesive layer. Generally, adhesion strength of a UV releasable adhesive is substantially reduced after exposing the UV releasable adhesive to a UV radiation, and the film can be easily removed by, for example, peeling off from the semiconductor device 100.

In other embodiments, the film may be a non-UV type. For example, in some embodiments, the film includes a thermoplastic polymer layer. The film of the non-UV type may be applied over the semiconductor device 100 using a high temperature (60° C.~80° C.) process to soften the thermoplastic polymer layer. The film is firmly attached to the semiconductor device 100 when the temperature of the film is reduced to the room temperature. In some embodiments, the film 501 may be a backgrinding (BG) tape (UV or non-UV type) which may be used to protect the semiconductor device 100 from grinding debris during a substrate thinning process. One advantageous feature of utilizing the film comprising the BG tape is that the same film may be used both for wafer thinning process and for forming the protective layer. Combining the above manufacture processes may lead to cost saving for semiconductor manufacturers.

Figure 5:
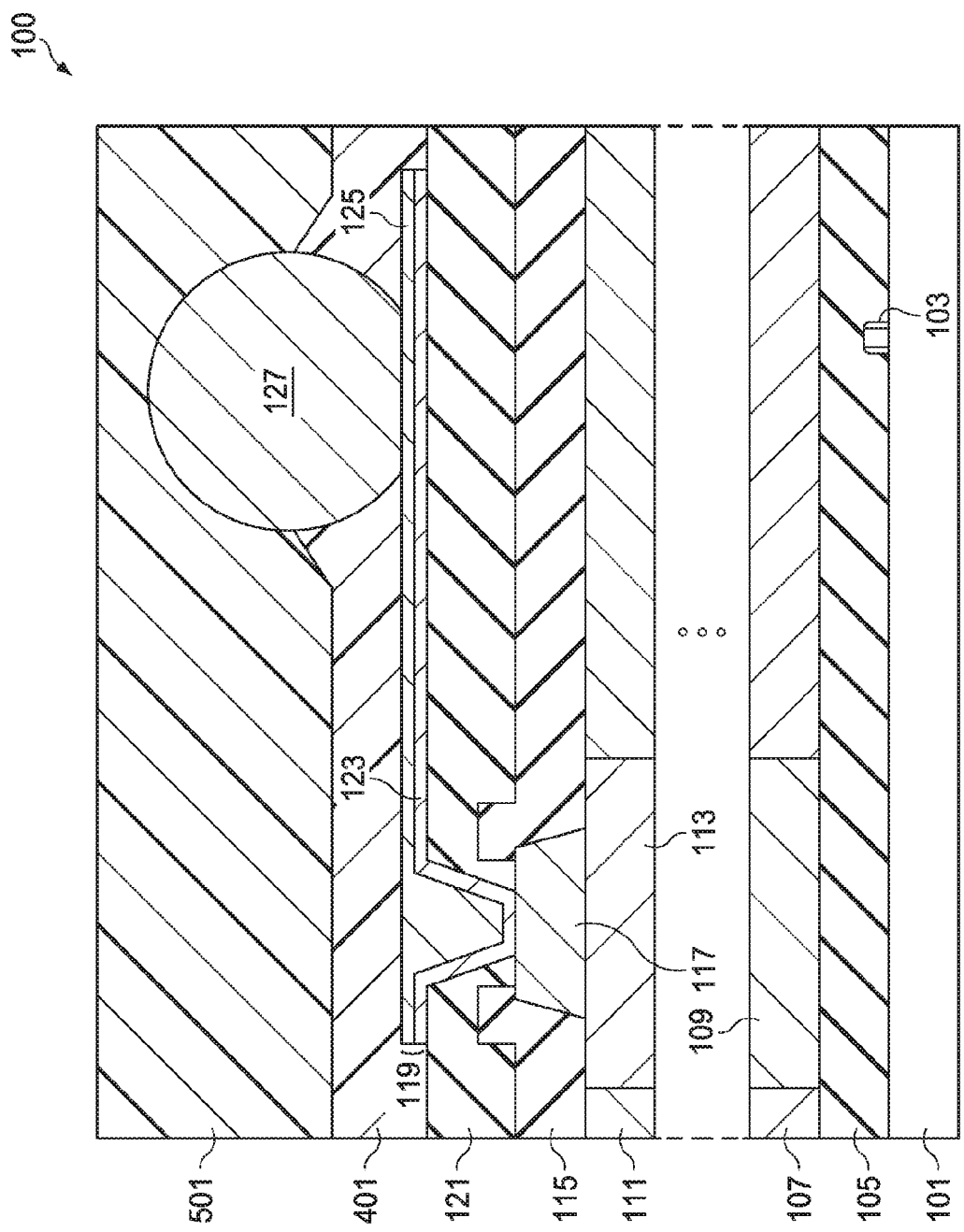
Figure 6:
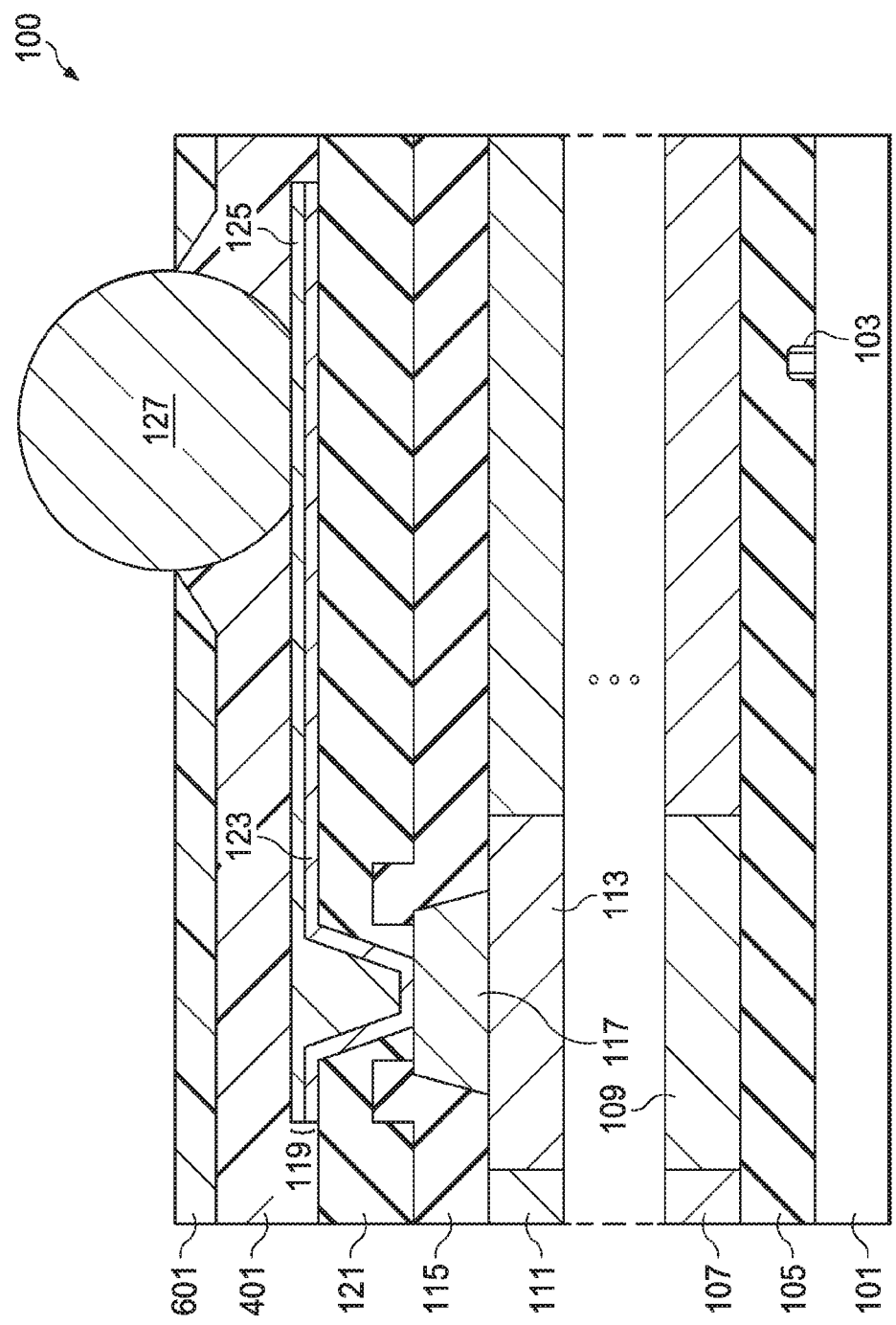

Referring first to FIGS. 5 and 6, a first method of forming a protective layer is illustrated in accordance with some embodiments. FIG. 5 illustrates a film 501, such as a thermoplastic polymer, applied over the semiconductor device 100 using, for example, a roller (not shown). The roller may apply a pressure between about 0.3 MPa and about 0.5 MPa and a temperature between about 30° C. and about 100° C. to the film 501. In some embodiments, the film 501 is forced into the voids in the molding layer 401 and fills the voids in the molding layer 401. The film 501 may have a sufficient thickness to fully cover the bump 127 as illustrated in FIG. 5.

Referring to FIG. 6, portions of the film (see FIG. 5) are removed from the semiconductor device 100 by, for example, peeling the film 501 from the molding layer 401. In some embodiments, the film 501 leaves residues comprising a thermoplastic polymer on the molding layer 401 and the bump 127. The residue of the film 501 seals the voids in the molding layer 401 and forms a protective layer 601 over the molding layer 401. The protective layer 601 protects the molding layer 401 and layers below from environmental effects, such as moisture.

In some embodiments, a plasma cleaning process may optionally be applied to the bump 127 to remove any residual material of the film 501 (see FIG. 5) on the top surface of the bump 127. The plasma clean process may also remove a portion of the top surface of the protective layer 601. In an embodiment, the plasma clean process is performed using an oxygen plasma, or the like, in an inert atmosphere such a nitrogen, argon, or the like. In some embodiments, the protective layer 601 comprises a thermoplastic polymer and may be formed to a thickness between about 0.5 μm and about 50 μm.

Figure 7:
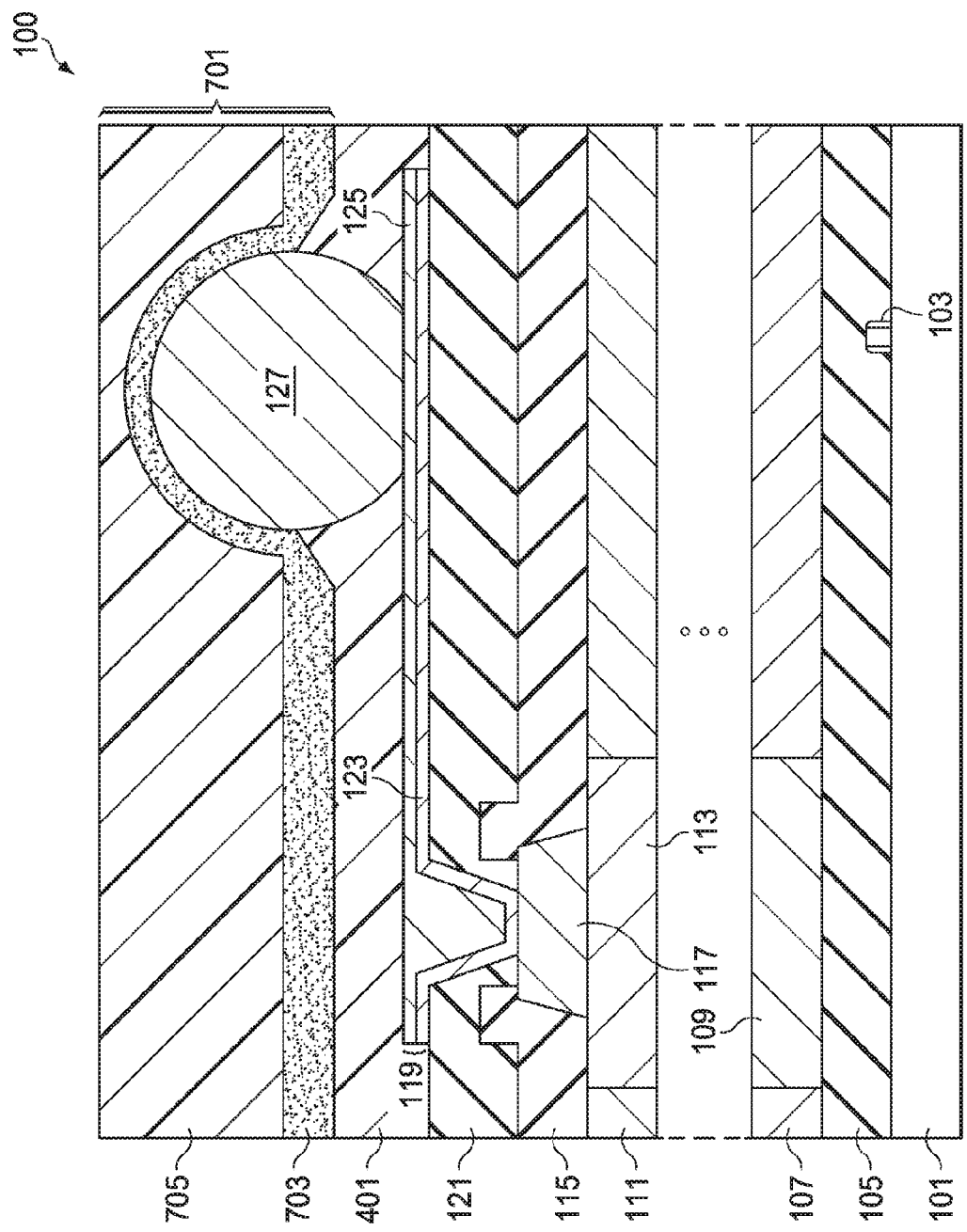
Figure 8:
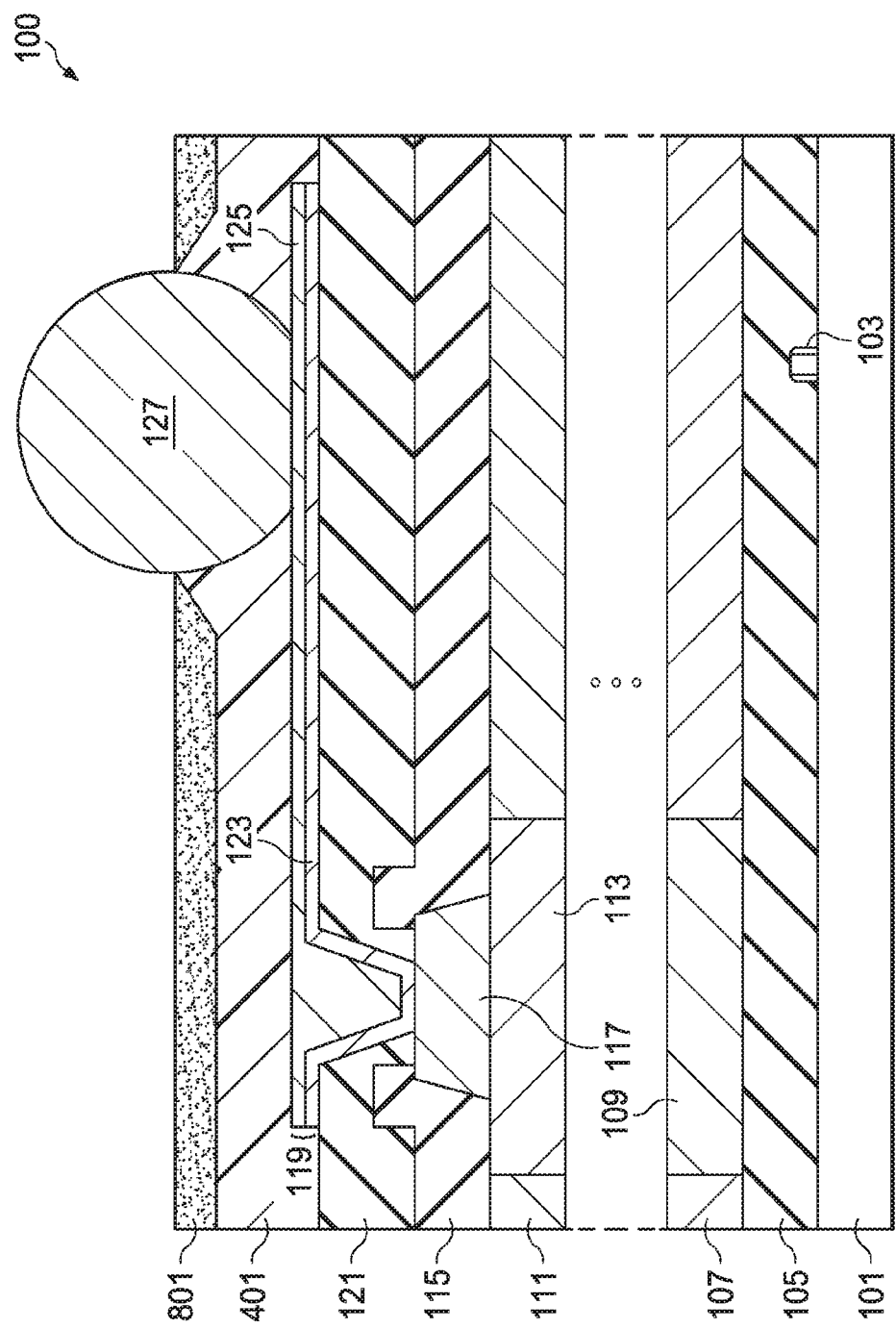

Referring to FIGS. 7 and 8, a second method of forming a protective layer is illustrated in accordance with some embodiments. Referring further to FIG. 7, the film 701 comprises a UV adhesive layer 703 having a thickness about 40 μm, and a base layer 705 having a thickness about 50 μm over the UV adhesive layer 703. In some embodiments, the film 701 may further comprise an optional resin layer (not shown) having a thickness about 350 μm between the UV adhesive layer 703 and the base layer 705. The base layer 705 may comprise a polymer material such as polyester, polypropylene (PP), polyethylene terephthalate (PET), and the like.

The film 701 may be applied over the semiconductor device 100 using, for example, a roller (not shown). The roller may apply a pressure between about 0.3 MPa and about 0.5 MPa and a temperature between about 30° C. and about 100° C. to the film 501. The film 701 is forced into the voids in the molding layer 401 and a UV adhesive material of the UV adhesive layer 703 fills the voids in the molding layer 401. The film 701 may have a sufficient thickness to fully cover the bump 127 as illustrated in FIG. 7.

Referring to FIG. 8, portions of the film 701 (see FIG. 7) are removed from the semiconductor device 100 by, for example, peeling the film 701 from the molding layer 401 and the bump 127 after exposing the film 701 to a UV radiation. In some embodiments, the film 701 leaves residues comprising a UV adhesive material of the UV adhesive layer 703 on the molding layer 401 and the bump 127. The film 701 may leave larger amount of residues over the molding layer 401 than over the bump 127 due the fact that adhesive strength between the UV adhesive layer 703 and the molding layer 401 is greater than adhesive strength between the UV adhesive layer 703 and the bump 127. The residue of the film 701 seals the voids in the molding layer 401 and forms a protective layer 801 over the molding layer 401 as illustrated in FIG. 8. The protective layer 801 protects the molding layer 401 and layers below from environmental effects, such as moisture.

In some embodiments, a plasma cleaning process may optionally be applied to the bump 127 to remove any residual material of the film 501. The plasma clean process may also remove a portion of the top surface of the protective layer 801. In an embodiment, the plasma clean process is performed using an oxygen plasma, or the like, in an inert atmosphere such a nitrogen, argon, or the like. In some embodiments, the protective layer 801 comprises a UV adhesive material and may be formed to a thickness between about 0.5 μm and about 50 μm.

Figure 9:
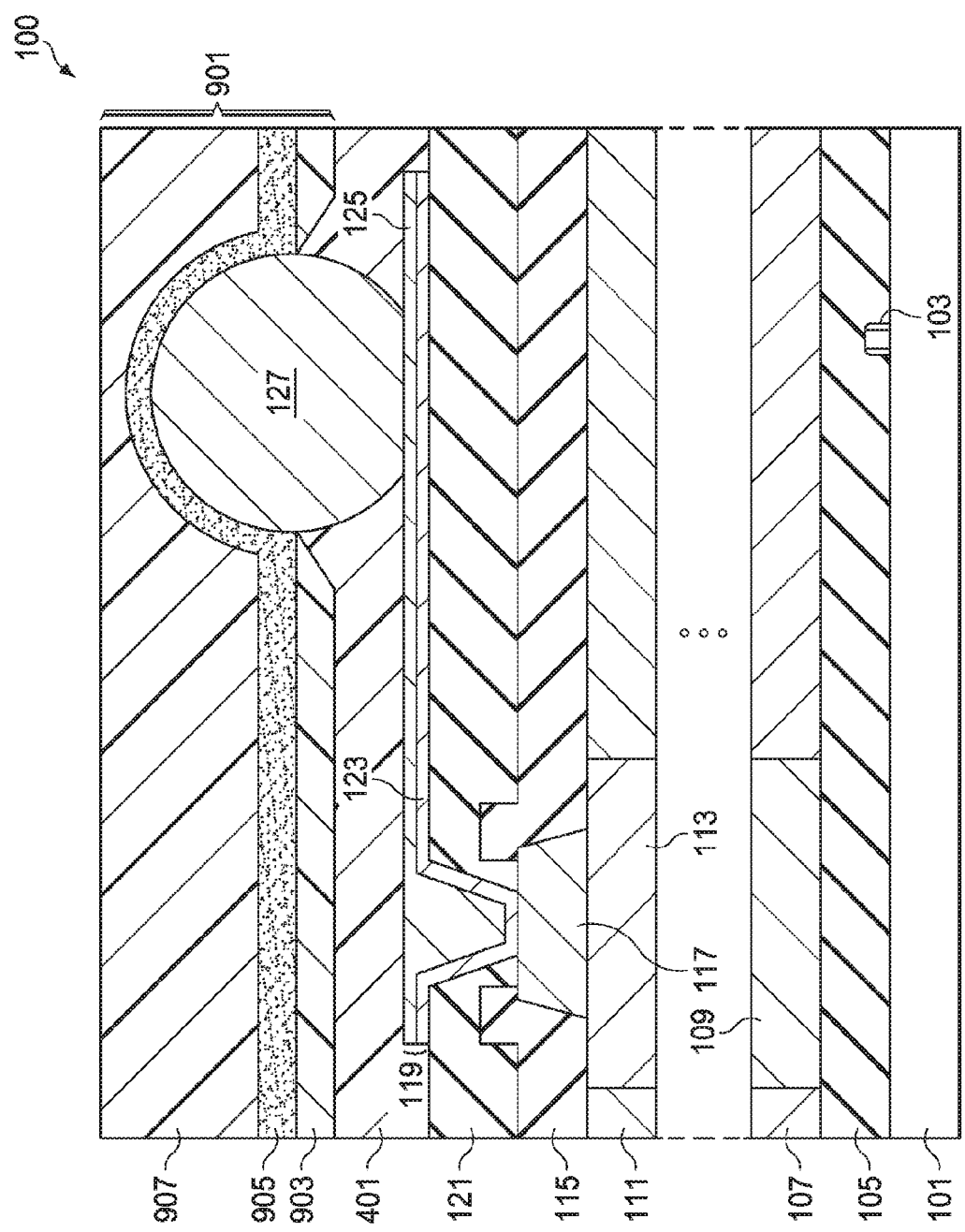
Figure 10:
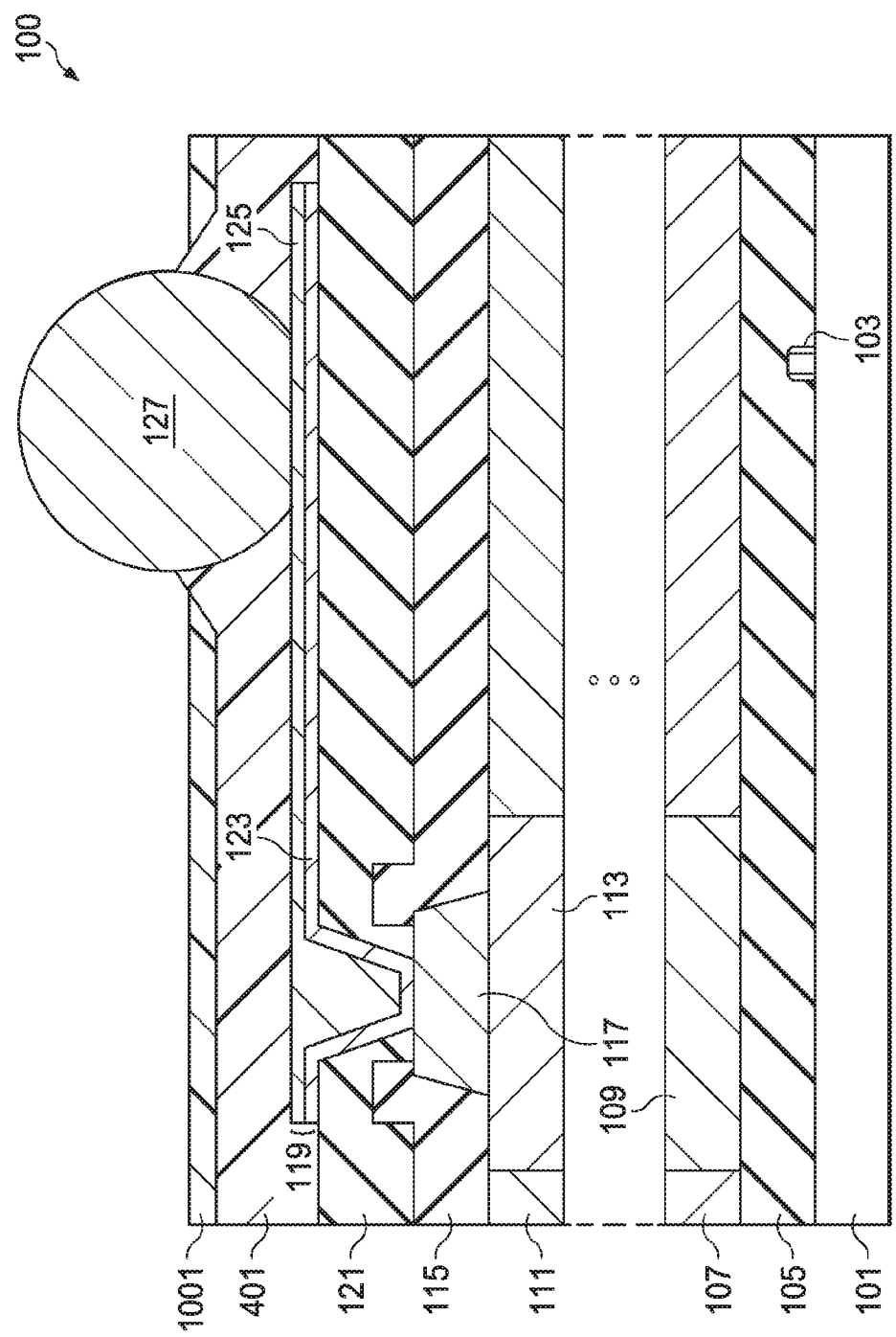

Referring to FIGS. 9 and 10, a third method of forming a protective layer is illustrated in accordance with some embodiments. Referring further to FIG. 9, a film 901 may include a UV release layer 905 sandwiched between a first polymer layer 903 and a second polymer layer 907. The UV release layer 905 may include materials similar to the UV adhesive layer 703 as discussed above with reference to FIG. 7. In some embodiments, the first polymer layer 903 is a thermoplastic polymer material, and the second polymer layer 907 is a polymer material such as polyester, polypropylene (PP), polyethylene terephthalate (PET), and the like.

The film 901 may be applied over the semiconductor device 100 using, for example, a roller (not shown). The roller may apply a pressure between about 0.3 MPa and about 0.5 MPa and a temperature between about 30° C. and about 100° C. to the film 901. The film 901 is forced into the voids in the molding layer 401 and a thermoplastic material of the first polymer layer 903 fills the voids in the molding layer 401. The film 901 may have a sufficient thickness to fully cover the bump 127 as illustrated in FIG. 9. In some embodiments, the first polymer layer 903 may be squeezed out between the bump 127 and the UV release layer 905, and the top surface of the bump 127 may be in contact with the UV release layer 905 as illustrated in FIG. 9.

Referring to FIG. 10, the second polymer layer 907 of the film 901 (see FIG. 9) is removed from the semiconductor device 100 by, for example, peeling the second polymer layer 907 from the first polymer layer 903 and the bump 127 after exposing the film 901 to a UV radiation. The first polymer layer 903 of the film 901 is left behind and forms a protective layer 1001 over the molding layer 401 as illustrated in FIG. 10. The protective layer 1001 protects the molding layer 401 and layers below from environmental effects, such as moisture.

In some embodiments, a plasma cleaning process may optionally be applied to the bump 127 to remove any residual material of the film 901, for example, a material of the UV release layer 905 and a material of the first polymer layer 903. The plasma clean process may also remove a portion of the top surface of the protective layer 1001. Therefore, the first polymer layer 903 of the film 901 may be applied with an initial thickness thick enough to compensate for material loss due to the plasma clean. In an embodiment, the plasma clean process is performed using an oxygen plasma, or the like, in an inert atmosphere such a nitrogen, argon, or the like. In some embodiments, the multilayer structure of the film 901, as described above with reference to FIG. 9, may provide a better control of the thickness of the protective layer 1001 over the molding layer 401. In some embodiments, the protective layer 1001 comprises a thermoplastic polymer and may be formed to a thickness between about 0.5 μm and about 50 μm.

Figure 11:
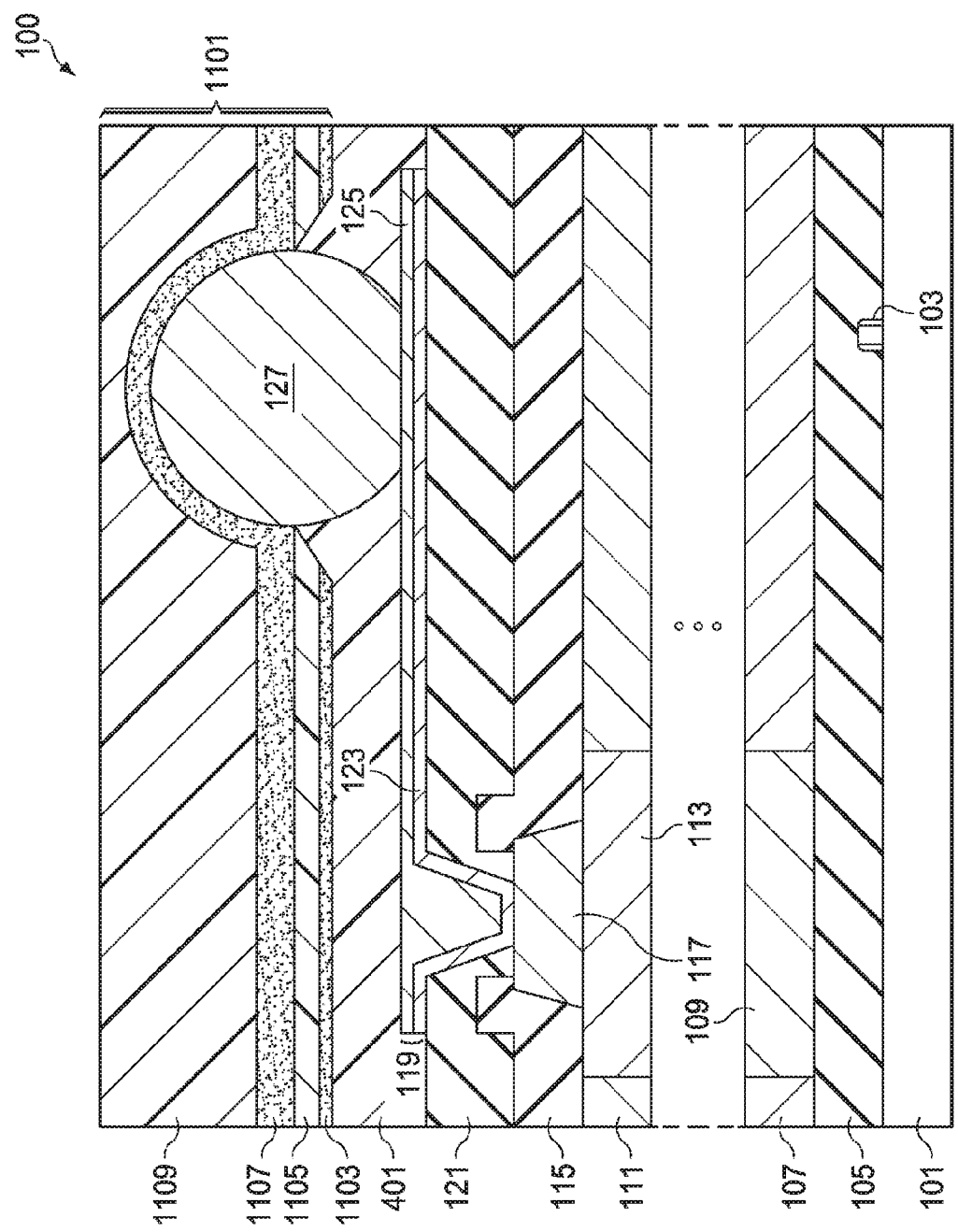
Figure 12:
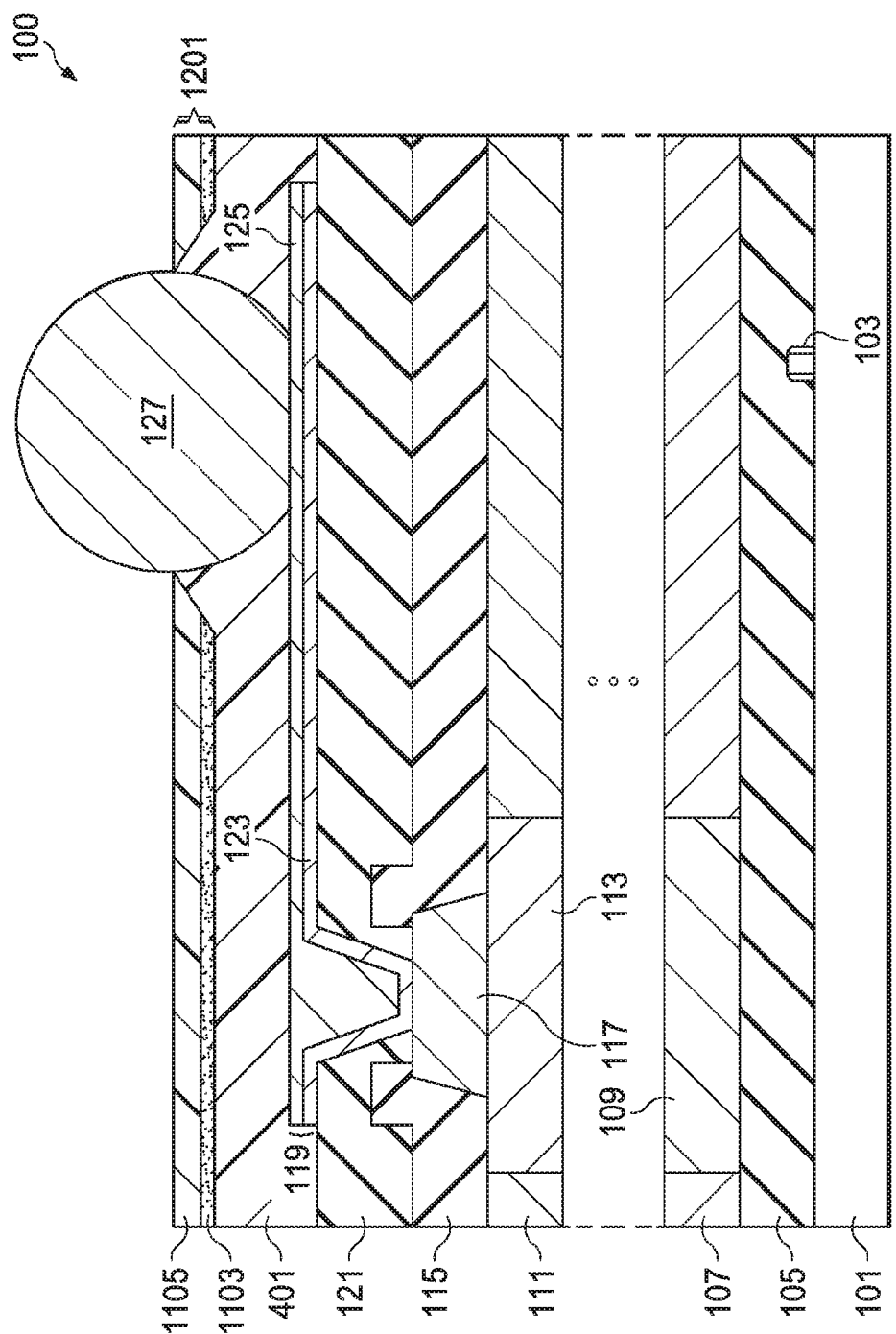

Referring to FIGS. 11 and 12, a fourth method of forming a protective layer is illustrated in accordance with some embodiments. Referring further to FIG. 11, a film 1101 comprises a UV adhesive layer 1103, a first polymer layer 1105 over the UV adhesive layer 1103, a UV release layer 1107 over the first polymer layer 1105, and a second polymer layer 1109 over the UV release layer 1107. The UV release layer 1107 may comprise materials similar to the UV adhesive layer 703 as discussed above with reference to FIG. 7. In some embodiments, the first polymer layer 1105 and the second polymer layer 1109 may comprise polyester, polypropylene (PP), polyethylene terephthalate (PET), and the like.

The film 1101 may be applied over the semiconductor device 100 using, for example, a roller (not shown). The roller may apply a pressure between about 0.3 MPa and about 0.5 MPa and a temperature between about 30° C. and about 100° C. to the film 501. The film 1101 is forced into the voids in the molding layer 401 and a UV adhesive material of the UV adhesive layer 1103 fills the voids in the molding layer 401. The film 1101 may have a sufficient thickness to fully cover the bump 127 as illustrated in FIG. 11. In some embodiments, the UV adhesive layer 1103 and the first polymer layer 1105 may be squeezed out between the bump 127 and the UV release layer 1107, and the top surface of the bump 127 may be in contact with the UV release layer 1107 as illustrated in FIG. 11.

Referring to FIG. 12, the second polymer layer 1109 of the film 1101 (see FIG. 11) is removed from the semiconductor device 100 by, for example, peeling the second polymer layer 1109 from the first polymer layer 1105 and the bump 127 after exposing the film 1101 to a UV radiation and curing the UV release layer 1107. The UV adhesive layer 1103 and the first polymer layer 1105 of the film 1101 are left behind and form a protective layer 1201 over the molding layer 401 as illustrated in FIG. 12. The protective layer 1201 protects the molding layer 401 and layers below from environmental effects, such as moisture.

Optionally, a plasma cleaning process is applied to the bump 127 to remove any residual material of the film 1101, for example, materials of the UV adhesive layer 1103, the UV release layer 1107, and the first polymer layer 1105. The plasma clean process may also remove a portion of the top surface of the protective layer 1201. Therefore, the first polymer layer 1105 of the film 1101 may be applied with an initial thickness thick enough to compensate for material loss due to the plasma clean. In an embodiment, the plasma clean process is performed using an oxygen plasma, or the like, in an inert atmosphere such a nitrogen, argon, or the like. In some embodiments, the multilayer structure of the film 1101, as described above with reference to FIG. 11, may provide a better control of the thickness of the protective layer 1201 over the molding layer 401. In some embodiments, the protective layer 1201 comprises the UV adhesive layer 1103 and the first polymer layer 1105, and may be formed to a thickness between about 0.5 μm and about 50 μm.

Figure 13:
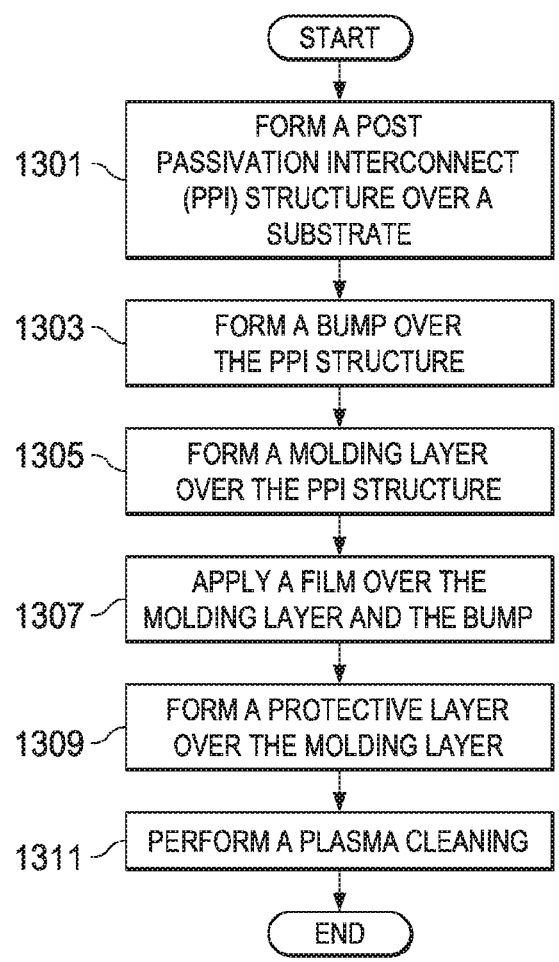
FIG. 13 is a flowchart illustrating a fabrication method for a semiconductor device having a chip scale packaging structure in accordance with some embodiments.

FIG. 13 is a flowchart illustrating a fabrication method for a semiconductor device having a chip scale packaging structure in accordance with some embodiments. The method begins at step 1301, wherein a post passivation interconnect (PPI) structure is formed over a substrate of the semiconductor device, such as that discussed above with reference to FIG. 1. In step 1303, a bump is formed over the PPI structure as discussed above with reference to FIG. 1. In step 1305, a liquid molding compound (LMC) material is applied over the PPI structure and the bump as described above with reference to FIG. 2. Subsequently, a pressure molding process and a curing process are performed on the LMC material to form a molding layer over the PPI structure as described above with reference to FIGS. 2-4. In step 1307, a film is applied over the molding layer and the bump using a roller as described above with reference to FIGS. 5, 7, 9, and 11. In step 1309, the film or a portion of the film is removed from over the molding layer and the bump and the remaining material of the film on the molding layer forms a protective layer as described above with reference to FIGS. 6, 8, 10, and 12. Finally, in step 1311, a plasma cleaning is preformed to remove the remaining material of the film from the top surface of the bump as described above with reference to FIGS. 6, 8, 10, and 12.

In an embodiment, a structure comprises a passivation layer over a substrate, a dielectric layer over the passivation layer, and a post passivation interconnect (PPI) structure over the dielectric layer, the PPI structure extending through the dielectric layer and electrically connected to a conductive pad. The structure further comprises a bump over the PPI structure, the bump being electrically connected to the PPI structure, a molding layer over the PPI structure, and a protective layer over the molding layer.

In another embodiment, a structure comprises a conductive pad on a substrate, a passivation layer over a substrate, the passivation layer having an opening over the conductive pad, and a post passivation interconnect (PPI) structure over the passivation layer, the PPI structure being electrically connected to the conductive pad. The structure further comprises a molding layer over the PPI structure, and a protective layer over the molding layer.

In yet another embodiment, a method comprises providing a substrate having a conductive pad thereon, forming a passivation layer over the substrate, the passivation layer having an opening over at least a portion of the conductive pad, forming a dielectric layer over the passivation layer, and forming a post passivation interconnect (PPI) structure over the dielectric layer, the PPI structure extending through the dielectric layer and electrically connected to the conductive pad. The method further comprises forming a bump over the PPI structure, the bump being electrically connected to the PPI structure, forming a molding layer over the PPI structure, and forming a protective layer over the molding layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
  a passivation layer over a substrate;
  a dielectric layer over the passivation layer;
  a post passivation interconnect (PPI) structure over the dielectric layer, the PPI structure extending through the dielectric layer and electrically connected to a conductive pad;
  a bump over the PPI structure, the bump being electrically connected to the PPI structure;
  a molding layer over the PPI structure and surrounding the bump, the molding layer comprising at least one void; and
  a protective layer over the molding layer, the protective layer sealing the at least one void of the molding layer, the protective layer having a first thickness proximal the bump and a second thickness distal the bump, the second thickness being larger than the first thickness.

2. The structure of claim 1, wherein the molding layer comprises a mixture of silica and epoxy.

3. The structure of claim 1, wherein the protective layer comprises a UV adhesive material.

4. The structure of claim 1, wherein the protective layer comprises a thermoplastic polymer layer.

5. The structure of claim 1, wherein the protective layer comprises a UV adhesive layer and a polymer layer.

6. The structure of claim 1, wherein the protective layer has a thickness between about 0.5 μm and about 50 μm.

7. The structure of claim 1, wherein the molding layer has a thickness between about 40 μm and about 150 μm.

8. A structure comprising:
  a conductive pad over a substrate;
  a passivation layer over the substrate, the passivation layer having an opening over the conductive pad;

a post passivation interconnect (PPI) structure over the passivation layer, the PPI structure being electrically connected to the conductive pad;

a bump over the PPI structure, the bump being electrically connected to the PPI structure;

a molding layer over the PPI structure and surrounding the bump; and a protective layer over the molding layer and surrounding the bump, the protective layer having a first thickness proximal the bump and a second thickness distal the bump, the second thickness being larger than the first thickness.

9. The structure of claim 8, further comprising a dielectric layer between the passivation layer and the PPI structure.

10. The structure of claim 8, wherein the bump extends through the molding layer and the protective layer.

11. The structure of claim 8, wherein the protective layer comprises a UV adhesive material.

12. The structure of claim 8, wherein the protective layer comprises a thermoplastic polymer layer.

13. The structure of claim 8, wherein the protective layer comprises a UV adhesive layer and a polymer layer.

14. The structure of claim 8, wherein the molding layer comprises at least one void, the protective layer sealing the at least one void of the molding layer.

15. A device comprising:

a conductive interconnect over a substrate, the conductive interconnect extending through a dielectric layer and electrically connected to a conductive feature on the substrate;

a conductive bump over the conductive interconnect, the conductive bump being electrically connected to the conductive interconnect;

a molding layer over the conductive interconnect and surrounding the conductive bump; and a protective layer over the molding layer, the protective layer comprising a UV adhesive layer and a polymer layer.

16. The device of claim 15, wherein the molding layer comprises at least one void, the protective layer sealing the at least one void of the molding layer.

17. The device of claim 15, wherein the conductive bump extends through the molding layer and the protective layer.

18. The device of claim 15 further comprising:

a passivation layer over the substrate, the passivation layer having an opening over the conductive feature, the dielectric layer being between the passivation layer and the conductive interconnect, the conductive interconnect and the dielectric layer extending through the opening in the passivation layer.

19. The device of claim 15, wherein the protective layer has a first thickness proximal the bump and a second thickness distal the bump, the second thickness being larger than the first thickness.

20. The structure of claim 1 further comprising:

a conductive pad over the substrate, the passivation layer having an opening over the conductive pad, the PPI structure being electrically connected to the conductive pad through the opening.

* * * * *